United States Patent
Chu et al.

(10) Patent No.: US 7,820,553 B2
(45) Date of Patent: Oct. 26, 2010

(54) PREVENTION OF TRENCH PHOTORESIST SCUM

(75) Inventors: Yin-Shen Chu, Taichung (TW); Chia-Piao Lee, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 800 days.

(21) Appl. No.: 11/185,047

(22) Filed: Jul. 20, 2005

(65) Prior Publication Data

US 2007/0020921 A1    Jan. 25, 2007

(51) Int. Cl.
    *H01L 21/302* (2006.01)
(52) U.S. Cl. .............................. 438/711; 257/E21.222; 257/E21.253
(58) Field of Classification Search .................. 438/711; 257/E21.222, E21.253
    See application file for complete search history.

(56) References Cited

U.S. PATENT DOCUMENTS 6,136,211 A * 10/2000 Qian et al. ..................... 216/37
7,352,064 B2 * 4/2008 Fuller et al. .................. 257/750
2002/0081854 A1 * 6/2002 Morrow et al. .............. 438/694
2003/0114010 A1 * 6/2003 Jung ........................... 438/707
2004/0043337 A1 * 3/2004 Chen et al. ................... 430/329
2004/0192058 A1 * 9/2004 Chu et al. .................... 438/710

OTHER PUBLICATIONS

Whitten et al., "General Chemistry", 1981 Saunders College Publishing, pp. 8-10, 656, 657.*
Marriam-Webster's Collegiate Dictionary, 1998, pp. 749.*
Wikipedia.org, "Diazene", printed Oct. 29, 2009.*

* cited by examiner

*Primary Examiner*—Lex Malsawma
(74) *Attorney, Agent, or Firm*—Slater & Matsil, L.L.P.

(57) ABSTRACT

Methods of preventing photoresist scum formation for etch processes for patterning material layers of semiconductor device material layers are disclosed. A treatment of $N_2$ and $O_2$ is used to prevent the formation of photoresist scum. The treatment may be performed in-situ, and may be performed during the etch process, after the etch process, or both. The treatment is particularly beneficial when implemented during the patterning of low dielectric constant material layers, and when used for the formation of isolated via patterns.

28 Claims, 4 Drawing Sheets

PREVENTION OF TRENCH PHOTORESIST SCUM

TECHNICAL FIELD

The present invention relates generally to the fabrication of semiconductor devices, and more particularly to methods of forming patterns in material layers using a layer of photoresist as a mask.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate or workpiece, and patterning the various layers using lithography to form circuit components and elements thereon.

One or more metallization layers are typically used to connect circuit components and elements together and to contact pads that may be used for external connection to the integrated circuit. If two or more metallization layers are used, vias are typically used to connect the metallization layers together. For example, a via may be used to connect a conductive line in a first metallization layer to a conductive line in an overlying second metallization layer. Vias are also used to connect through insulating layers to underlying circuit components and elements. For example, a via may be used to connect a circuit component to a conductive line in an overlying metallization layer. Vias may also be used to connect conductive lines or circuit components to contact pads and/or bond pads, for example.

Vias can be challenging to pattern, because they typically are quite small, and may comprise a minimum feature size of a semiconductor device in some applications, for example. As feature sizes become smaller and smaller, as is the trend in the semiconductor industry, via formation becomes even more challenging.

Damascene techniques are often used to form vias. In a damascene technique, a dielectric material is deposited on a wafer, and then the dielectric material is patterned with the desired via pattern. The dielectric material may be patterned by depositing a photoresist, patterning the photoresist with the desired via pattern, and using the photoresist as a mask to pattern the dielectric material, for example. The via pattern typically comprises a plurality of trenches, holes, or apertures, for example. The via pattern is then filled in with a conductive material, and a chemical-mechanical polish (CMP) process is used to remove the excess conductive material from the top surface of the dielectric material, leaving a plug or via of conductive material in the via pattern. The conductive material remaining within the dielectric material comprises the via. Conductive lines and vias in metallization layers are often formed using a damascene technique, for example.

A problem in prior art methods of etching via patterns in dielectric materials is the formation of photoresist scum on the sidewalls and the bottom surfaces of the via trenches being formed. The photoresist scum can cause the formation of oxides in undesired regions within the via trenches, resulting in increased resistance of the via. Lengthy cleaning processes may be required in an attempt to remove the photoresist scum from within the via trenches. Photoresist scum increases the cost of manufacturing and may decrease product yields.

Thus, what are needed in the art are methods of eliminating and preventing photoresist scum in semiconductor device manufacturing.

SUMMARY OF THE INVENTION

These and other problems are generally solved or circumvented, and technical advantages are generally achieved, by preferred embodiments of the present invention, which comprise novel via etch treatments to solve the problem of trench photoresist scum.

In accordance with a preferred embodiment of the present invention, a method of patterning a material layer of a semiconductor device includes depositing a layer of photoresist over the material layer, patterning the layer of photoresist, exposing portions of the material layer, and etching the exposed portions of at least the material layer to form at least one trench in the material layer. The at least one trench is treated with $N_2$ and $O_2$.

In accordance with another preferred embodiment of the present invention, a method of fabricating a semiconductor device includes providing a workpiece, depositing an insulating material layer over the workpiece, and depositing a layer of photoresist over the insulating material layer. The layer of photoresist is patterned, exposing portions of the insulating material layer. The exposed portions of at least the insulating material layer are etched away to form trenches in at least the insulating material layer. The trenches are treated with $N_2$ and $O_2$, the layer of photoresist is removed, and a conductive material is deposited within the trenches in the insulating material layer.

In accordance with yet another preferred embodiment of the present invention, a method of forming at least one via of a semiconductor device includes providing a workpiece having an insulating material layer formed thereon, depositing a layer of photoresist over the insulating material layer, patterning the layer of photoresist with a pattern for at least one via, and patterning at least the insulating material layer using the layer of photoresist as a mask to form at least one via pattern in at least the insulating material layer. The at least one via pattern is treated with $N_2$ and $O_2$, the layer of photoresist is removed, and a conductive material is deposited within the at least one via pattern in the insulating material layer, wherein the conductive material within the at least one via pattern comprises the at least one via.

Advantages of embodiments of the present invention include preventing the formation of photoresist scum in semiconductor device patterning processes. Manufacturing yields and device performance are improved, and the cost of manufacturing is decreased, by the use of embodiments of the present invention. The required queue time required for processing steps to manufacture the semiconductor devices is decreased; thus, the queue time may be increased without the formation of photoresist scum.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
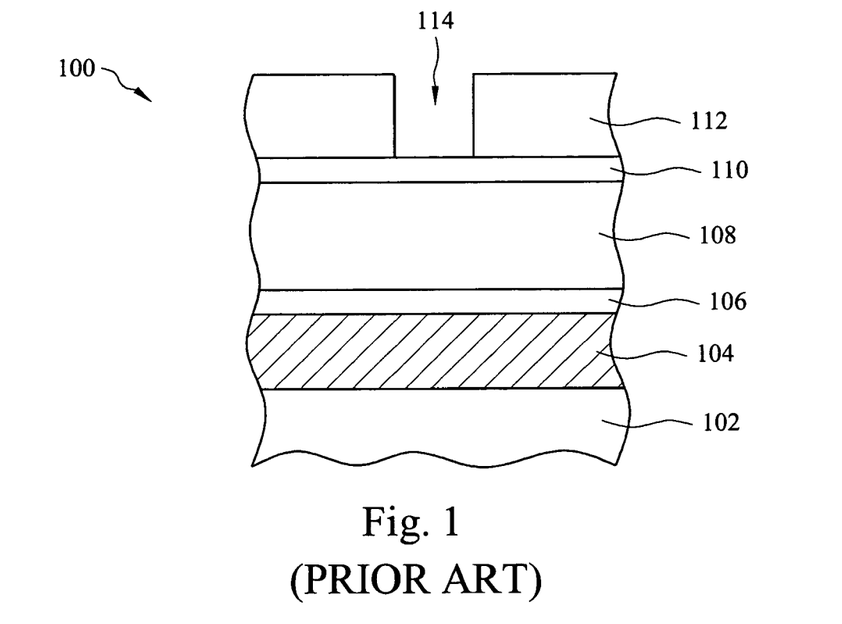
FIGS. 1 and 2 show cross-sectional views of a prior art method of patterning a via trench, wherein photoresist scum forms on the sidewalls and bottom of the trench.

FIG. 1 shows a cross-sectional view of a prior art method of patterning a via trench or via pattern of a semiconductor device 100. A workpiece 102 is provided which may have circuit elements such as transistors and other devices formed thereon. A metallization layer may be formed over the workpiece 102 having conductive lines 104 formed therein. An etch stop layer 106 may be disposed over the metallization layer. An insulating layer 108 is formed over the workpiece 102, e.g., disposed over the etch stop layer 106, as shown. An anti-reflective coating (ARC) 110 may be disposed over the insulating layer 108.

To pattern the insulating layer 108 with via trenches, a layer of photoresist 112 is deposited over the insulating layer 108, e.g., over the anti-reflective coating 110, as shown. The layer of photoresist 112 is patterned with a desired pattern for one or more trenches, also shown.

Figure 2:
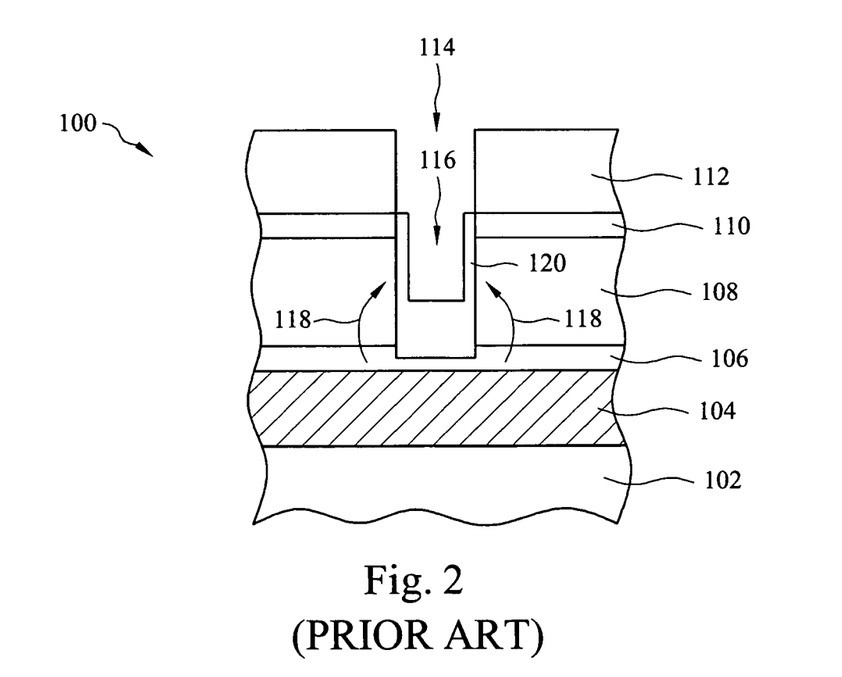

Referring next to FIG. 2, the layer of photoresist 112 is used as a mask while exposed portions of at least the insulating layer 108 are etched away using an etchant 114. The etchant 114 may comprise Ar, $CF_4$, $O_2$, $C_4F_8$, He, $N_2$, or $CH_3F$, as examples. For example, exposed portions of the anti-reflective coating 110 may also be removed. The etch process may be designed to stop when the etch stop layer 106 is reached or exposed, or alternatively, the etch process may continue so that a top portion of the etch stop layer 106 is etched away, as shown in FIG. 2. A via pattern 116 is formed in at least the insulating layer 108, as shown. The via pattern 116 is also referred to herein as a trench 116 or a via trench 116, for example.

A problem with prior art patterning and etching techniques used to form via patterns 116 is that photoresist scum 120 may form on the sidewalls and bottom surface of the via patterns 116. The photoresist scum 120 tends to form contaminants that may emit from material layers disposed over the workpiece 102, such as etch stop layer 106. For example, the etch stop layer 106 may comprise SiC or tetra ethyl oxysilane (TEOS), which may release $NH_x$ 118 that rises upwards (e.g., through the insulating layer 108) towards the via pattern 116 sidewalls and bottom surface during the etch 114 process, reacting with the photoresist 112 particles that may be released during the etch 114 process. The photoresist scum 120 may comprise a polymer including the $NH_x$ and photoresist, for example. The photoresist may comprise an acid and the $NH_x$ may comprise a base, as another example. The reaction may be represented by Equation 1:

$$3CH_3-Si-H + NH_3 \Rightarrow NH_x + 3SiC \qquad \text{Eq. 1}$$

The photoresist scum 120 can be difficult to remove from the trenches 116 and may grow more problematic as the queue time of semiconductor device 100 is increased. For example, lots having a queue time of greater than about 6 hours have exhibited a higher percentage of photoresist scum 120 problems. The formation of photoresist scum 120 has been observed to particularly be a problem for isolated via patterns 116, for example.

Figure 3:
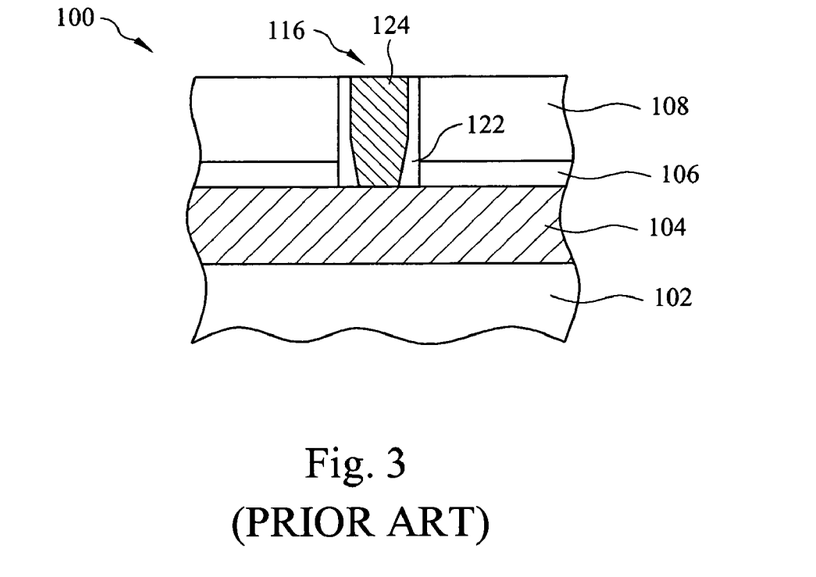
FIG. 3 illustrates an oxide that can form in a via trench as a result of the photoresist scum, which results in a decreased area of the conductive material of the via making contact with an underlying conductive line, causing increased resistance of the via.

When the photoresist 112 is later removed, e.g., using an ash process, the photoresist scum 120 may leave behind an oxide material/residue or insulative contaminant 122 in the via patterns or trenches 116, as shown in FIG. 3. The oxide material/residue or insulative contaminant 122 may reside on portions of the sidewalls of the via pattern 116 and may tend to collect in the corners of the via pattern 116, as shown. A conductive material 124 is then deposited over the via pattern 116, and excess conductive material 124 is removed from over the top surface of the insulating material 108, as shown. The conductive material 124 left remaining in the via pattern 116 trench comprises a conductive via 124.

The oxide material/residue or insulative contaminant 122 in the via pattern 116 is problematic because reduced electrical connection is made to the underlying conductive line 104, thus increasing the resistance of the via 124 or the electrical connection of the via 124 to the conductive line 104. The insulative contaminant 122 forms in the via pattern 116 as a result of the photoresist scum 120 (see FIG. 2), which results in decreased area of the conductive material 124 of the via 124 making contact with an underlying conductive line 104 and thus causing increased resistance of the via 124. In extreme cases, no electrical connection may be made by the via 124 to the underlying conductive line 104, resulting in a device 100 failure, and the semiconductor device 100 must be scrapped. The insulative contaminant 122 may comprise an oxide residue that disconnects the link between the via 124 and the conductive line 104, for example.

Photoresist scum 120 causes manufacturing yields to decrease and causes a decrease in semiconductor device 100 performance. Photoresist scum 120 also causes an increase in the cost of manufacturing of semiconductor devices 100.

Prior art methods to remove photoresist scum 120 involve cleaning the semiconductor devices 100 prior to depositing the conductive material 124, e.g., with $O_2$, $N_2$, or CO. However, these cleaning processes are time-consuming, increasing queue time, and may not remove all of the photoresist scum 120 from the trenches. Furthermore, the additional cleaning processes may damage the thin material layers of the semiconductor device 100 and may cause the devices 100 to require additional reworks to repair the damage from the additional cleaning processes.

Figure 4:
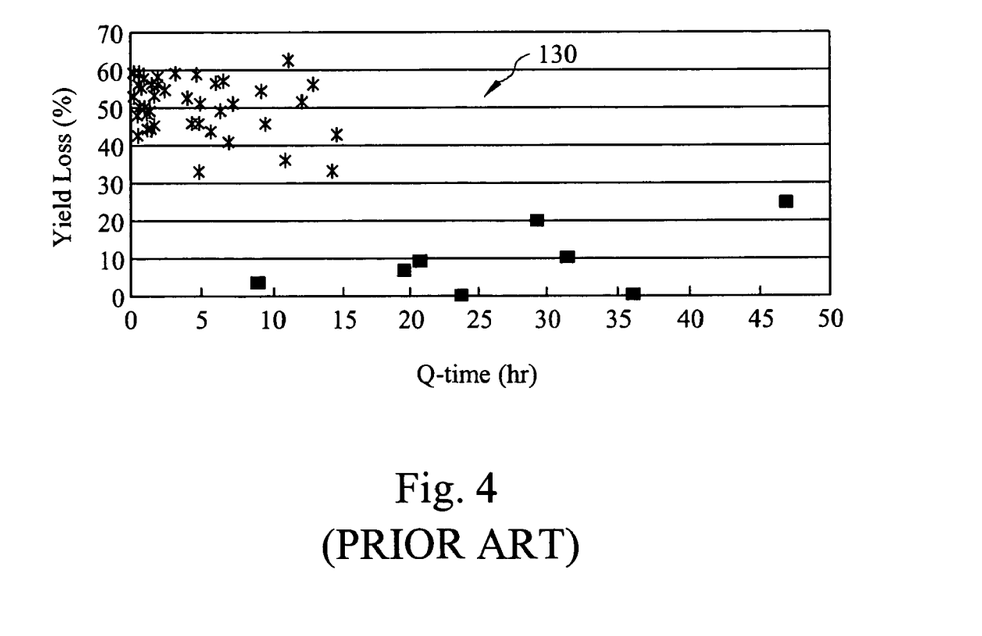
FIG. 4 is a plot showing that unless trench patterns are cleaned of photoresist scum, yield loss is high.

FIG. 4 is a plot 130 showing that unless trench patterns are cleaned of photoresist scum, yield loss for semiconductor devices is high. Queue time for semiconductor wafer lots in hours is shown on the x axis, and the yield loss for a plurality of lots as a percentage is shown on the y axis. The plot 130 shows that the majority of lower yield lots were caused by longer queue times, e.g., lots having queue times of greater than 10 hours exhibited the lowest yields.

Thus, what are needed in the art are methods of preventing the formation of photoresist scum.

Embodiments of the present invention achieve technical advantages by providing novel methods of preventing the formation of photoresist scum in etch processes. A novel treatment of $N_2$ and $O_2$ is disclosed that prevents photoresist scum formation.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in the formation of via patterns or via trenches. The invention may also be applied, however, to the formation of other conductive features, such as conductive lines, plates of capacitors, or gates of transistors, as examples.

Figure 5:
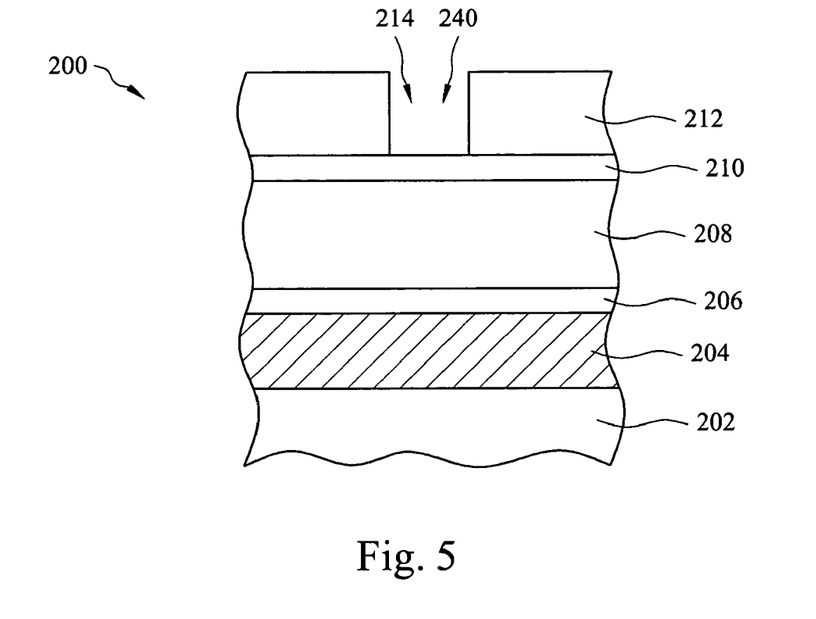
FIG. 5 shows a cross-sectional view of an embodiment of the present invention, wherein a treatment is introduced to prevent the formation of photoresist scum in via trenches.
Figure 6:
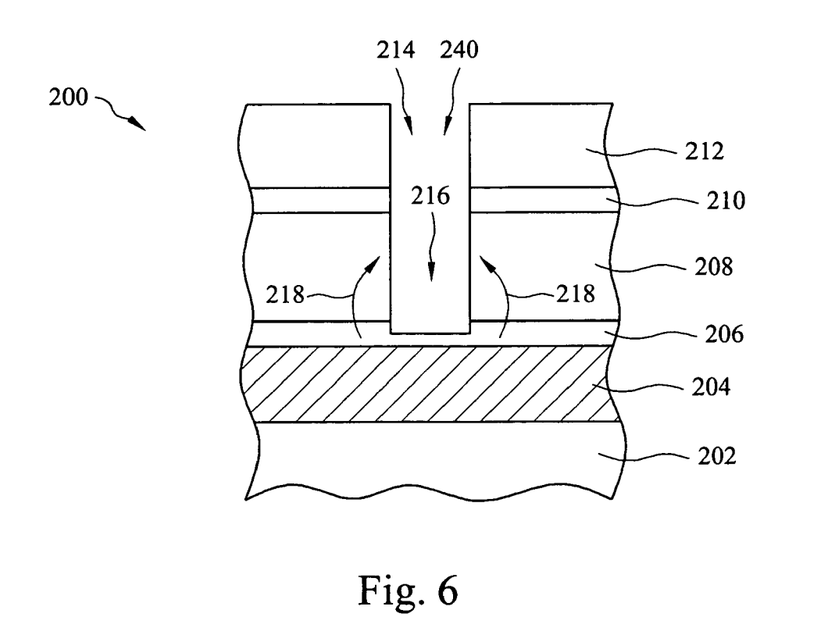
FIG. 6 shows a via trench patterned in accordance with an embodiment of the present invention.
Figure 7:
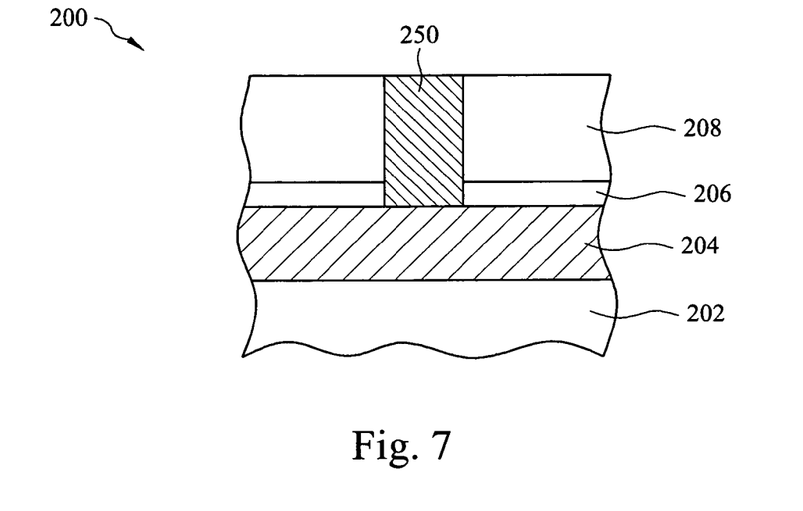
FIG. 7 shows a via formed in accordance with an embodiment of the present invention, making full contact to a top surface of a conductive line in an underlying material layer.

FIGS. 5 through 7 show cross-sectional views of a preferred embodiment of the present invention, wherein a novel treatment is introduced to prevent the formation of photoresist scum in via trenches. Like numerals are used to label the elements shown in FIGS. 5 through 7 are were used to label the elements in FIGS. 1 through 3. Only one trench is shown in FIGS. 5 through 7; however, there may be a plurality of trenches formed on a semiconductor device 200, for example.

Referring to FIG. 5, a workpiece 202 is provided. The workpiece 202 may include a semiconductor substrate comprising silicon or other semiconductor materials covered by an insulating layer, for example. The workpiece 202 may also include other active components or circuits formed in the front end of line (FEOL), not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon.

An optional conductive material layer may be formed over the workpiece 202. The conductive material layer may comprise a plurality of conductive lines 204 adapted to electrically connect portions of the semiconductor device 200 together, for example. The conductive lines 204 may comprise aluminum, copper, other metals, or alloys thereof, as examples, although alternatively, the conductive lines 204 may comprise other materials. The conductive lines 204 may be formed in an insulating material layer using a subtractive etch or damascene process (not shown).

An optional etch stop layer 206 may be formed over the conductive lines 204, or over the workpiece 202, if no conductive lines 204 are used, as shown. The etch stop layer 206 may comprise an etch stop material for a low dielectric constant (k) material, such as SiC, SiN, TEOS, or combinations thereof, as examples, although the etch stop layer 206 may alternatively comprise other materials.

An insulating material layer 208 is formed over the etch stop layer 206, or over the workpiece 202 if conductive lines 204 and etch stop layer 206 are not used. The insulating material layer 208 may comprise dielectric materials such as $SiO_2$, SiN, or combinations thereof, although alternatively, the insulating material layer 208 may comprise low dielectric constant materials or high dielectric constant materials, as examples. In one embodiment, the insulating material layer 208 preferably comprises a dielectric material having a dielectric constant of about 3.5 or less. For example, the insulating material layer 208 may comprise Black Diamond™ by Applied Materials, Silk™ by Dow Chemical Company, a Coral™ film by Novellus Systems Inc., or combinations or multiple layers of these materials and other materials, as examples, although alternatively, the insulating material layer 208 may comprise other materials.

An optional anti-reflective coating (ARC) 210 may be formed over the insulating material 208, as shown in FIG. 5. The ARC 210 may comprise SiON, as an example, although alternatively, the ARC 210 may comprise other materials.

A layer of photoresist 212 is deposited over the ARC 210, or over the insulating material layer 208, if no ARC 210 is used. The layer of photoresist 212 is patterned with a desired pattern that will be transferred to the insulating material layer 208, e.g., for a pattern for at least one trench. Portions of the top material layer, e.g., ARC 210 in FIG. 5, are left exposed after the layer of photoresist 212 is patterned, as shown.

Next, an etchant 214 is used to etch away the exposed portions of at least the insulating material layer 208, as shown in FIG. 6. For example, exposed portions of the ARC 210 may also be etched away. The etchant 214 preferably comprises an etch chemistry of Ar, $CF_4$, $O_2$, $C_4F_8$, He, $N_2$, $CH_3F$, or combinations thereof, as examples, although alternatively, other etch chemistries may be used. The etch process may be designed to stop when the etch stop layer 206 is reached, or the etch process may comprise a timed etch, for example. The etch process may be designed to stop shortly after the etch stop layer 206 is reached, as shown in FIG. 6; thus, a top portion of the etch stop layer 206 may be removed when the etchant 214 is introduced.

In accordance with a preferred embodiment of the present invention, after the etch process using the etchant 214, a treatment 240 of $N_2$ and $O_2$ is used to treat the trenches 216 formed during the etch process using the etchant 214. In some embodiments, the treatment 240 preferably comprises about 5 to 50 standard cubic centimeters per minute (s.c.c.m.) of $N_2$ and about 200 to 1,000 s.c.c.m. of $O_2$, as examples, although other amounts of $N_2$ and $O_2$ may alternatively be used.

The treatment 240 is preferably adapted to neutralize any substances 218 that may arise from the lower material layers, such as the etch stop layer 206, for example. In one embodiment, for example, the etch stop layer 206 emits a contaminant such as $NH_x$, that if untreated would cause the formation of photoresist scum on the sidewalls. The treatment 240 is preferably adapted to prevent the photoresist scum from remaining on the sidewalls and bottom surface of the trench.

In another embodiment, the treatment 240 is performed on the trench 216 simultaneously with the etching process using the etchant 214, for example. In yet another embodiment, the treatment 240 is used both during the etching process using the etchant 214, and also after the etching process is completed.

Advantageously, the novel treatment 240 eliminates and/or prevents the formation of photoresist scum on the sidewalls of the trench 216. The treatment 240 preferably comprises an in-situ treatment. For example, the treatment 240 is preferably performed while the workpiece 202 remains in the chamber that the workpiece 202 was placed in for the etching process using the etchant 214.

Next, the layer of photoresist 212 is removed. The layer of photoresist 212 may be removed using an ash process, for example. The ARC 210 is also removed. Any remaining etch stop layer 206 is removed, and a conductive material 250 is deposited over the trench 216. The conductive material 250 may comprise aluminum, copper, tungsten, other metals, or alloys thereof, as examples, although alternatively, the conductive material 250 may also comprise other materials. The conductive material 250 may include liners or seed layers, not shown, for example. Excess conductive material 250 is then removed from over the top surface of the insulating material layer 208, using a CMP process or etch process, for example. The conductive material 250 left remaining in the trench comprises a conductive via 250, as shown in FIG. 7.

Advantageously, because photoresist scum was prevented from forming or from being left remaining in the trench pattern for the via 250, full contact is made by the bottom surface of the via 250 to the top surface of the conductive line 204 (or to an active area in the workpiece 202, if no conductive line 204 is used).

Another advantage of embodiments of the present invention is that the time required for the ash process required to remove the photoresist may be reduced, using the novel treatment 240 of the present invention. For example, the ash process to remove the layer of photoresist 212 (FIG. 6) may comprise a first required time period, and treating the trench 216 with the treatment 240 may decrease the first required time period of the ash process. With the use of the treatment 240, the first required time period of the ash process may be reduced to about 40 seconds or less, in one embodiment, although alternatively, the adjusted first required time period may comprise other time periods.

The treatment 240 may be used for a variety of times, in one embodiment. For example, if the treatment 240 is performed after the etching process using the etchant 214, the time period for the treatment 240 required to prevent photoresist scum formation may comprise about 60 seconds or less, although alternatively, other time periods may be required. If the treatment 240 is performed simultaneously with the etch process using the etchant 214, the required time period for the treatment 240 to be effective in preventing photoresist scum formation may comprise the time period for the etch process or less, for example. In one embodiment, the treatment 240 may be performed at intervals during the etch process using the etchant, e.g., in bursts of about 2 seconds each about 15 seconds apart, although alternatively, other intervals of treatment 240 application may be used.

In one embodiment, the treatment 240 includes $N_2$ and $O_2$, and also includes CO, for example. The treatment 240 may include about 5 to 50 s.c.c.m. of $N_2$, about 200 to 1,000 s.c.c.m. of $O_2$, and about 5 to 80 s.s.c.m. of CO, as examples, although alternatively, the treatment 240 may comprise other amounts of these chemistries. The treatment 240 may also include other chemicals, such as Ar, He, CO, $H_2$, or combinations thereof, as examples, although alternatively, other chemicals may be used.

As an example, in one embodiment, the treatment 240 is preferably performed at a pressure of about 100 milliTorr (mt) and a power level of about 550 watts (W), using about 400 s.s.c.m. of $O_2$, and about 20 s.s.c.m. of $N_2$, although alternatively, other parameters may also be used.

Figure 8:
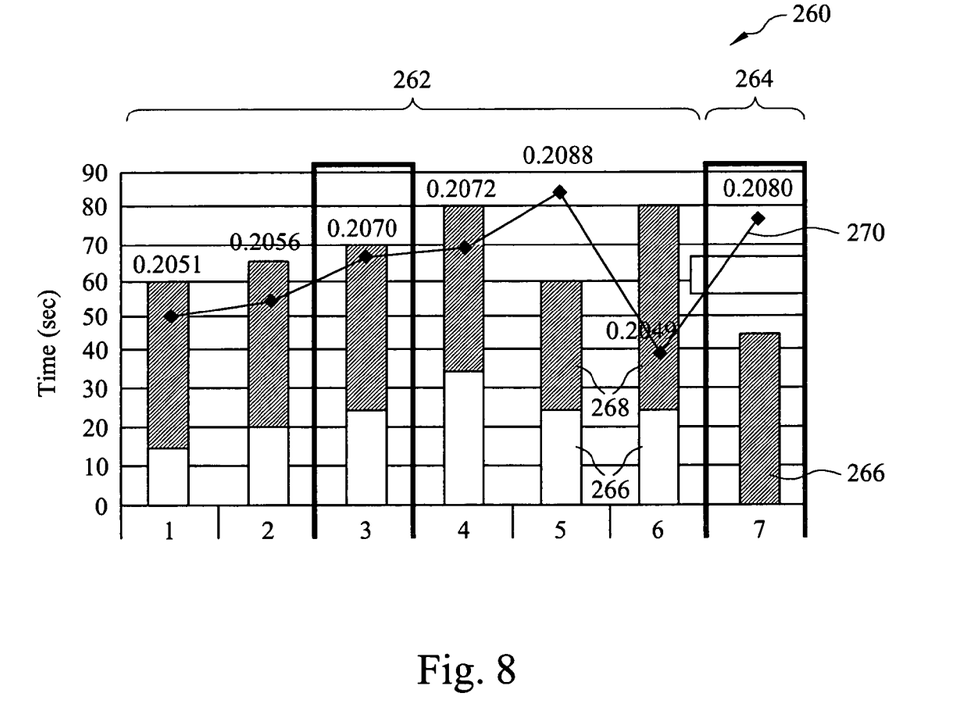
FIG. 8 is a graph illustrating the results of various treatment times and ash times in accordance with embodiments of the present invention, compared to a prior art etch method having no photoresist scum treatment.

FIG. 8 is a graph 260 illustrating the various treatment times and ash times in accordance with embodiments of the present invention, compared to a prior art etch method for forming via trenches having no photoresist scum treatment. The results for each lot (e.g., lots 1 through 7) are shown along the x axis, and the time (0 to 90 seconds) is shown on the y axis in seconds. For example, shown at 262 are the ash times 266 and treatment times 268 for a plurality of lots of semiconductor workpieces 202 that were fabricated using the novel treatment 240 described herein. The amount of time for an ash process to remove the photoresist is shown at 266, and the time for the novel treatment 240 of embodiments of the present invention is shown at 268, for wafer lots 1 through 6, in region 262 of the graph. The amount of time for an ash process (266) to remove the photoresist using a prior art etch method is shown at 264, for wafer lot 7. Table 1 below shows the amount of time required for the ash process 266 and treatment 240, for example. The prior art method had no treatment 240. The results of Table 1 are shown graphically in FIG. 8.

TABLE 1

|  | 1 | 2 | 3 | 4 | 5 | 6 | 7 |
|---|---|---|---|---|---|---|---|
| treatment time (seconds) | 45 | 45 | 45 | 45 | 35 | 55 | 0 |
| ash time (seconds) | 15 | 20 | 25 | 35 | 25 | 25 | 45 |

Also shown in FIG. 8 is the via critical dimension (CD) mean at 270 for each lot, superimposed on the graph 260 of the time values. The etch bias was comparable for each of the split conditions (e.g., in lots 1 through 6). For example, the etch bias of embodiments of the present invention has been found to be comparable within 1 sigma (e.g., about 3 nm). The term "etch bias" as used herein refers to the after etch inspection critical dimension (AEI CD) less the after development inspection critical dimension (ADI CD), as shown in Equation 2:

$$\text{etch bias} = (AEI\ CD - ADI\ CD) \quad \text{Eq. 2}$$

Furthermore, ash times 266 were reduced by the use of embodiments of the present invention.

Embodiments of the present invention include methods of patterning material layers of a semiconductor device with at least one trench, and semiconductor devices patterned in accordance with the methods described herein. Embodiments of the present invention also include methods of fabricating a semiconductor device, and methods of forming at least one via of a semiconductor device, as examples.

Advantages of embodiments of the invention include solving the problem of photoresist scum formation. The formation of photoresist scum is prevented, increasing device yields. Semiconductor devices may be manufactured using additional processing steps and using longer queue times, in some applications. This may be advantageous for semiconductor devices where an increased queue time (for processing steps other than reworks and attempting to remove the photoresist scum) is desirable. For example, the queue time for other processing steps may be increased to over 12 hours by the use of the novel treatment 240 process described herein, without concern of photoresist scum formation. Overall queue time required to manufacture semiconductor devices is decreased, because the need for prior art time-consuming and repetitive cleaning steps to remove photoresist scum are eliminated. Reworks are also reduced, further decreasing the queue time for semiconductor devices.

The resistance $R_c$ of vias manufactured using embodiments of the present invention meet required specifications, and have shown a shift of less than about 3%. The etch bias has been found to be comparable within acceptable limits.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of patterning a material layer of a semiconductor device, the method comprising:
   depositing a layer of photoresist over a first surface of the material layer;
   patterning, after the depositing, the layer of photoresist, thereby forming a patterned photoresist, exposing portions of the material layer;
   etching the exposed portions of at least the material layer to form at least one trench in the material layer;
   treating the at least one trench with $N_2$ and $O_2$, the $N_2$ being two nitrogen atoms bonded only to each other and the $O_2$ being two oxygen atoms bonded only to each other; and
   removing the patterned photoresist from the first surface of the material layer, the removing being performed after the treating.

2. The method according to claim 1, wherein treating the at least one trench comprises an in-situ treatment.

3. The method according to claim 1, wherein treating the at least one trench is performed after etching the exposed portions of at least the material layer.

4. The method according to claim 1, wherein treating the at least one trench is performed simultaneously while etching the exposed portions of at least the material layer.

5. The method according to claim 1, wherein the material layer comprises a dielectric material having a dielectric constant of about 3.5 or less.

6. The method according to claim 1, wherein an etch stop layer is disposed beneath the material layer, wherein a bottom surface of the at least one trench extends to a top surface of the etch stop layer or lower, wherein the etch stop layer emits a contaminant during etching the exposed portions of at least the material layer, and wherein treating the at least one trench with the combination of $N_2$ and $O_2$ passivates the contaminant.

7. The method according to claim 6, wherein the contaminant emitted by the etch stop layer comprises $NH_x$.

8. The method according to claim 6, wherein the etch stop layer comprises SiC, tetra ethyl oxysilane (TEOS), SiN, or combinations thereof.

9. The method according to claim 6, wherein the at least one trench further comprises sidewalls, wherein the contaminant causes formation of photoresist scum on the sidewalls and bottom surface of the at least one trench, and wherein treating the at least one trench with the $N_2$ and the $O_2$ prevents the photoresist scum from remaining on the sidewalls and bottom surface of the at least one trench.

10. The method according to claim 1, wherein removing the patterned photoresist comprises an ash process, the ash process comprising a first required time period.

11. The method according to claim 10, wherein treating the at least one trench decreases the first required time period of the ash process.

12. The method according to claim 10, wherein the first required time period of the ash process comprises about 40 seconds or less.

13. The method according to claim 12, wherein treating the at least one trench comprises a second required time period, wherein the second required time period comprises about 60 seconds or less.

14. The method according to claim 1, wherein etching the exposed portions of at least the material layer comprises using an etch chemistry of Ar, $CF_4$, $O_2$, $C_4F_8$, He, $N_2$, $CH_3F$, or combinations thereof.

15. The method according to claim 1, wherein treating the at least one trench further comprises treating with compound CO.

16. The method according to claim 15, wherein treating the at least one trench comprises treating the at least one trench with about 5 to 80 standard cubic centimeters per minute (s.c.c.m.) of CO.

17. The method according to claim 1, wherein treating the at least one trench comprises a pressure of about 100 milliTorr (mt) and a power level of about 550 watts (W), using about 400 standard cubic centimeters per minute (s.c.c.m.) of $O_2$, and about 20 s.c.c.m. of $N_2$.

18. The method according to claim 1, wherein the at least one trench comprises a pattern for a via, a conductive line, a plate of a capacitor, or a gate of a transistor.

19. The method according to claim 1, wherein treating the at least one trench comprises treating the at least one trench with about 5 to 50 standard cubic centimeters per minute (s.c.c.m.) of $N_2$ and about 200 to 1000 s.c.c.m. of $O_2$.

20. A method of fabricating a semiconductor device, the method comprising:
   providing a workpiece;
   depositing an insulating material layer over the workpiece;
   depositing a layer of photoresist over a first surface of the insulating material layer;
   patterning the layer of photoresist, exposing portions of the insulating material layer;
   etching away the exposed portions of at least the insulating material layer to form trenches in at least the insulating material layer;
   treating the trenches with $N_2$ and $O_2$, the $N_2$ consisting of nitrogen atoms bonded together, the $O_2$ consisting of oxygen atoms bonded together;
   removing the patterned photoresist from the first surface of the insulating material layer, the removing being performed after the treating; and
   depositing a conductive material within the trenches in the insulating material layer.

21. The method according to claim 20, wherein treating the trenches comprises an in-situ treatment.

22. The method according to claim 20, further comprising depositing an etch stop layer over the workpiece before depositing the insulating material layer, wherein the etching away the exposed portions of at least the insulating material layer comprises stopping the etching process when a top surface of the etch stop layer or lower is reached.

23. The method according to claim 22, wherein the etch stop layer emits a contaminant while etching away the exposed portions of at least the insulating material layer, and wherein treating the trenches with the $N_2$ and the $O_2$ passivates the contaminant.

24. The method according to claim 20, wherein removing the patterned photoresist comprises an ash process, wherein treating the trenches decreases a time period required for the ash process.

25. The method according to claim 20, wherein treating the trenches further comprises treating with compound CO.

26. The method according to claim 20, wherein depositing the conductive material comprises forming at least one via, conductive line, plate of a capacitor, or gate of a transistor, within the insulating material layer.

27. A method of forming at least one via of a semiconductor device, the method comprising:
    providing a workpiece having an insulating material layer formed thereon;
    depositing a layer of photoresist over a first surface of the insulating material layer;
    patterning the layer of photoresist with a pattern for at least one via;
    patterning at least the insulating material layer using the layer of photoresist as a mask to form at least one via pattern in at least the insulating material layer;
    treating the at least one via pattern with $N_2$ molecules and $O_2$ molecules;
    removing the patterned layer of photoresist from the first surface of the insulating material layer, the removing being performed after the treating; and
    depositing a conductive material within the at least one via pattern in the insulating material layer, wherein the conductive material within the at least one via pattern comprises the at least one via.

28. The method according to claim 27, wherein photoresist scum forms on sidewalls and a bottom surface of the at least one via pattern while patterning at least the insulating material layer, wherein the treating the at least one via pattern with the $N_2$ molecules and the $O_2$ molecules removes the photoresist scum from the sidewalls and bottom surface of the at least one via pattern.

* * * * *